(12) United States Patent
Agranov et al.

(10) Patent No.: US 9,601,538 B2
(45) Date of Patent: Mar. 21, 2017

(54) IMAGE SENSORS WITH PHOTOELECTRIC FILMS

(71) Applicant: Semiconductor Components Industries, LLC, Phoenix, AZ (US)

(72) Inventors: Gennadiy Agranov, San Jose, CA (US); Jaroslav Hynecek, Allen, TX (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 675 days.

(21) Appl. No.: 13/860,157

(22) Filed: Apr. 10, 2013

(65) Prior Publication Data

US 2013/0292548 A1 Nov. 7, 2013

Related U.S. Application Data

(60) Provisional application No. 61/642,380, filed on May 3, 2012.

(51) Int. Cl.
*H01L 27/00* (2006.01)
*H01L 27/146* (2006.01)
*H01L 27/30* (2006.01)

(52) U.S. Cl.
CPC ...... *H01L 27/14643* (2013.01); *H01L 27/146* (2013.01); *H01L 27/307* (2013.01)

(58) Field of Classification Search
CPC   H01L 27/14643; H01L 27/146; H01L 27/307
USPC ........................................ 250/208.1; 348/294
See application file for complete search history.

(56) References Cited

U.S. PATENT DOCUMENTS

| | | | | |
|---|---|---|---|---|
| 5,625,210 A | * | 4/1997 | Lee ................... | H01L 27/14609 257/233 |
| 7,888,759 B2 | * | 2/2011 | Ihama ........................... | 257/435 |
| 8,436,441 B2 | | 5/2013 | Mitsui et al. | |
| 8,471,315 B1 | * | 6/2013 | Hynecek et al. ............. | 257/292 |

(Continued)

OTHER PUBLICATIONS

Ihama et al., "CMOS Image Sensor with an Overlain Organis Photoelectric Conversion Layer: Optical Advantages of Capturing Slanting Rays of Light" Paper No. P33, Fuji Film Corporation, Japan.

*Primary Examiner* — Thanh Luu
*Assistant Examiner* — Kevin Wyatt
(74) *Attorney, Agent, or Firm* — Treyz Law Group, P.C.; Kendall W. Abbasi; Joseph F. Guihan

(57) ABSTRACT

An image sensor with an organic photoelectric film for converting light into charge may be provided. The image sensor may include an array of image sensor pixels. Each image sensor pixel may include a charge-integrating pinned diode that collects photo-generated charge from the photoelectric film during an integration period. An anode electrode may be coupled to an n+ doped charge injection region in the charge-integrating pinned diode and may be used to convey the photo-generated charge from the photoelectric film to the charge-integrating pinned diode. Upon completion of a charge integration cycle, a first transfer transistor gate may be pulsed to move the charge from the charge-integrating pinned diode to a charge-storage pinned diode. The charge may be transferred from the charge-storage pinned diode to a floating diffusion node for readout by pulsing a gate of a second charge transfer transistor.

20 Claims, 5 Drawing Sheets

(56) References Cited

U.S. PATENT DOCUMENTS

| | | | |
|---|---|---|---|
| 2005/0051701 A1* | 3/2005 | Hong | 250/214.1 |
| 2006/0044243 A1* | 3/2006 | Rysinski | H04N 5/37452 |
| | | | 345/92 |
| 2008/0225142 A1* | 9/2008 | Goto | H01L 27/14621 |
| | | | 348/272 |
| 2009/0147091 A1* | 6/2009 | Myers | H04N 5/23248 |
| | | | 348/208.99 |
| 2009/0256060 A1* | 10/2009 | Meynants | H04N 5/353 |
| | | | 250/208.1 |
| 2011/0228148 A1* | 9/2011 | Takata | H01L 27/307 |
| | | | 348/273 |
| 2012/0049044 A1* | 3/2012 | Kuboi | H01L 27/1464 |
| | | | 250/208.1 |
| 2012/0161270 A1* | 6/2012 | Maehara | H01L 27/307 |
| | | | 257/432 |
| 2013/0087682 A1 | 4/2013 | Nomura | |
| 2015/0194469 A1* | 7/2015 | Joei | H01L 27/307 |
| | | | 257/40 |

* cited by examiner

IMAGE SENSORS WITH PHOTOELECTRIC FILMS

This application claims the benefit of provisional patent application No. 61/642,380, filed May 3, 2012, which is hereby incorporated by reference herein in its entirety.

BACKGROUND

This relates to solid-state image sensors and, more specifically, to image sensors with small size pixels that use photoelectric films for conversion of light into electrons or holes. In such sensors, it can be difficult to achieve a charge transfer scheme for transferring charge from the charge integration node to the charge detection node that does not introduce significant kTC noise into the signal Conventional image sensors sense light by converting impinging photons into electrons or holes that are integrated (collected) in sensor pixels. Upon completion of each integration cycle, the collected charge is converted into voltage signals, which are then supplied to corresponding output terminals associated with the image sensor. Typically, the charge-to-voltage conversion is performed directly within the pixels, and the resulting analog pixel voltage signals are transferred to the output terminals through various pixel addressing and scanning schemes. The analog signal can sometimes be converted on-chip to a digital equivalent before being conveyed off-chip. Each pixel includes a buffer amplifier, commonly a source follower (SF), which is used to drive output sensing lines that are connected to the pixels via respective address transistors.

After charge-to-voltage conversion is complete and after the resulting signals are transferred out from the pixels, the pixels are reset before a subsequent integration cycle begins. In pixels having floating diffusions (FD) serving as the charge detection node, this reset operation is accomplished by momentarily turning on a reset transistor that connects the FD node to a fixed voltage reference for draining (or removing) any charge transferred on the FD node. However, removing charge from the floating diffusion node using the reset transistor generates kTC-reset noise, as is well known in the art.

In conventional CMOS image sensors, the light-to-charge conversion occurs in the silicon substrate in a separate pixel area that is dedicated for the purpose of converting light into charge. This could be, for example, a simple n+ p diode or a pinned photodiode. However, another class of CMOS image sensors exists in which the CMOS sensor circuitry built in the substrate is overlaid by an organic photoelectric conversion layer (sometimes referred to as a charge generating layer). In this type of image sensor, the charge generating layer covers essentially the whole pixel area. Thus, the area in the substrate that was previously used exclusively for light-to-charge conversion circuitry may not be needed.

This type of image sensor may eliminate the need for micro-lenses over the sensor pixels. This type of image sensor may also be configured to convert light into charge with high quantum efficiency (QE) and does not necessarily need to rely on the intrinsic silicon properties. It is thus possible to reduce the thickness of the overlaid material layer, which will in turn reduce the pixel cross talk and the demands on the sensor camera optics. An example of this type of sensor has been described in a paper entitled: "CMOS Image Sensor with an Overlaid Organic Photoelectric Conversion Layer: Optical Advantages of Capturing Slanting Rays of Light," by Mikio Ihama et al., incorporated herein as a reference.

FIG. 1 is a simplified cross-sectional side view of a conventional image sensor pixel 100. As shown in FIG. 1, conventional image sensor pixel 100 includes silicon p type doped epitaxial layer 101 deposited on a p+ type doped substrate 102. Oxide layer 112 is formed on top of epitaxial layer 101 and also extends and fills the shallow trench isolation (STI) regions 103. Oxide layer 112 also serves as a gate oxide for the pixel transistors. A reset transistor is formed by n+ diffusion region 104, n+ floating diffusion (FD) region 105, and gate poly-silicon region 111. Similarly, the source follower (SF) transistor is formed by n+ region 106, n+ region 107, and gate region 110. A pixel row select transistor is formed by n+ region 107, gate region 109, and n+ source region 108.

Oxide isolation layer 113 is deposited over the poly-silicon gates to provide isolation for the pixel metal wiring, which is only partially shown as connection 117 in pixel 100. Wire 117 provides the necessary electrical connection of the FD to the gate of the SF transistor. Metal vias 115, 116, 124, and 125 provide connections between the circuit elements that are built within the silicon substrate and on top of it to the corresponding pixel wiring. Additional oxide isolation layers such as oxide isolation layer 114 are deposited on the metal interconnects wiring. For simplicity, not all of these oxide isolation layers are shown in FIG. 1.

Layer 118 serves as a light shield to protect the substrate circuits from the impinging light. Metal layer 119, which is electrically connected to the FD, is the anode electrode for the organic photoelectric layer 121. Transparent and conductive layer 123 serves as a cathode electrode for the organic photoelectric layer. Cathode electrode 123 is biased by a negative bias Vb, approximately equal to −10V. Pixel 100 also includes electron blocking layer 122 and hole blocking layer 120. These layers are necessary to prevent the direct injection of charge from the electrodes into the structure and thus to make sure that only the photo-generated carriers are detected. Photons 126 enter pixel 100 from front side 100F.

During operation of pixel 100, the FD charge detection node is reset by momentarily pulsing gate 111 positive, and the photo-generated electrons are integrated on the FD node. The photo-generated holes flow directly into cathode electrode 123. The potential change of the FD node is sensed by the source follower transistor, and this potential change is transferred onto the column readout circuits when the row select transistor is momentarily pulsed on. When the sensing is completed, the FD node is reset again. It is common practice to use a double sampling (DS) signal processing technique to detect only the difference between the signal level before and after the reset. This eliminates any transistor threshold variation from the signal and ensures sensing uniformity across the array. However, this procedure has been known to generate kTC-reset noise, as mentioned above. Moreover, pixel 100 cannot be used in a global shutter (GS) mode of operation where all the pixels are exposed to the impinging light simultaneously without any time skew.

It may therefore be desirable to be able to provide improved image sensors with low-noise charge reset and charge integration schemes.

DETAILED DESCRIPTION

Figure 1:
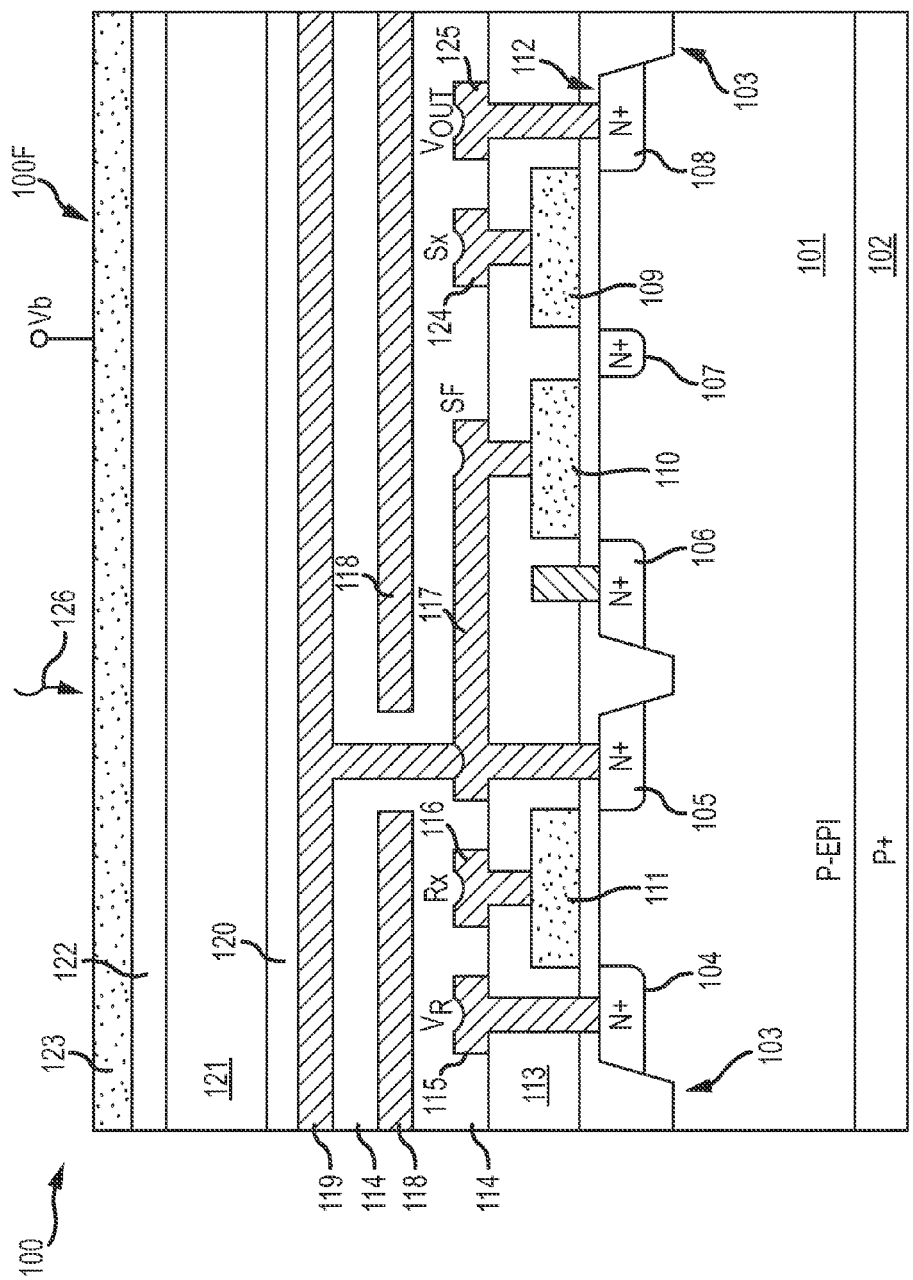
FIG. 1 is a simplified cross-sectional side view of a conventional image sensor pixel.
Figure 2:
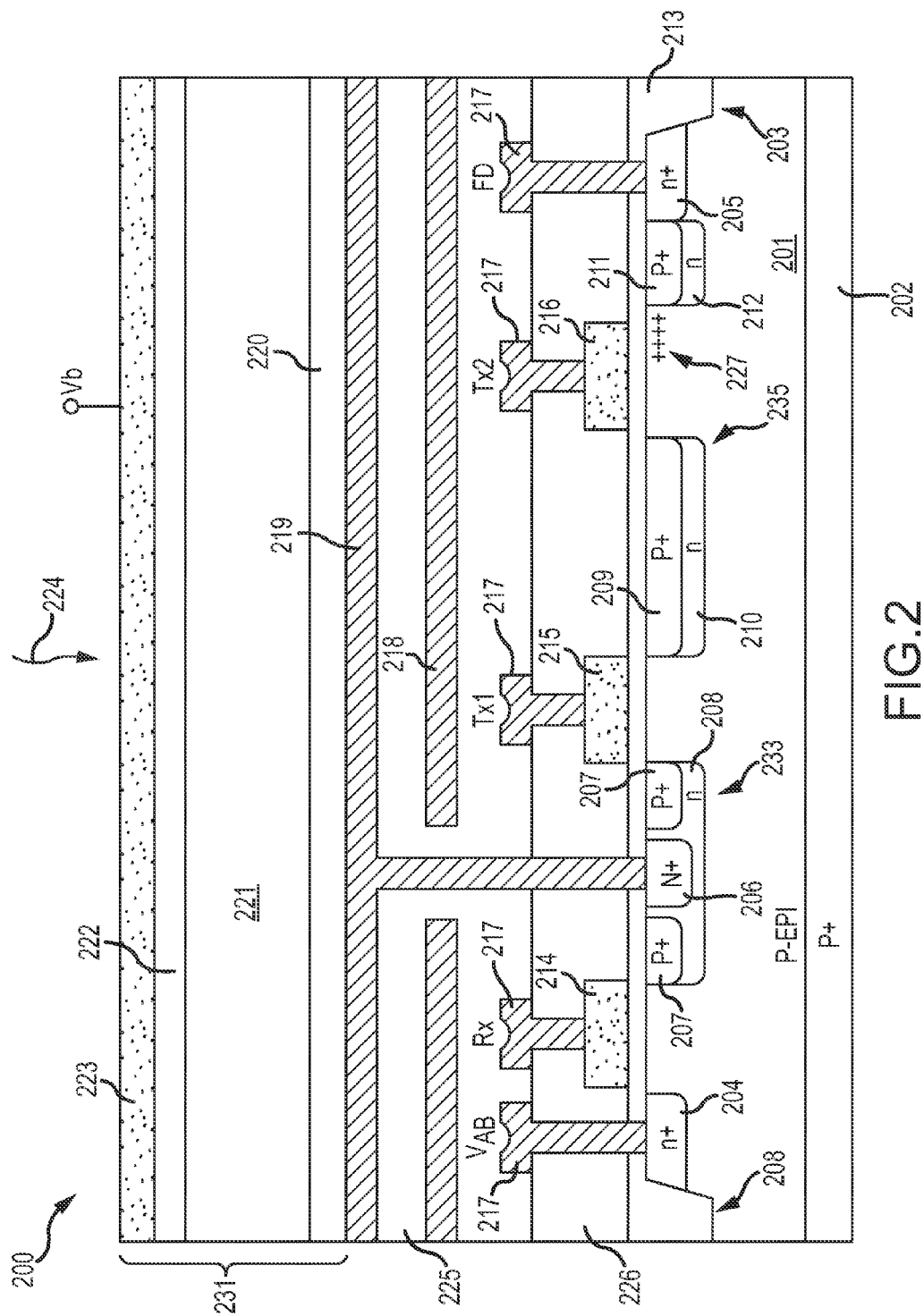
FIG. 2 is a simplified cross-sectional side view of an illustrative image sensor pixel having a pinned photodiode for collecting photo-generated electrons in accordance with an embodiment of the present invention.

FIG. 2 is a simplified cross-sectional side view of an illustrative image sensor pixel 200. As shown in FIG. 2, pixel 200 may include a silicon p type doped epitaxial layer such as p type epitaxial layer 201 deposited on a p+ type doped substrate such as p+ substrate 202. Pixel 200 may also include a photoelectric layer stack such as photoelectric layer stack 231. Photoelectric layer stack 231 may include a cathode electrode such as transparent cathode electrode 223, an electron blocking layer such as electron blocking layer 220, a hole blocking layer such as hole blocking layer 222, a photoelectric conversion layer such as photoelectric conversion layer 221 for generating electron-hole pairs when photons 224 enter pixel 200, and an anode electrode such as anode electrode 219. Transparent cathode electrode 223 may, for example, be biased by a negative bias Vb. Pixel 200 may include additional layers such as color filter layers and/or protective layers deposited on top of transparent cathode electrode 223. For simplicity, these layers are not shown in FIG. 2.

Anode electrode 219 may be connected to an n+ type doped injector region such as n+ type doped injector region 206 that inputs charge into a charge-integrating pinned diode such as pinned diode 233. As shown in FIG. 2, pinned diode 233 may be formed from p+ type doped regions 207 and n type doped region 208, which forms the potential well for collecting the injected charge from the n+ doped injector region 206. Charge-integrating pinned diode 233 with n+ charge injector region 206 may be formed in p type doped epitaxial layer 201 that is deposited on p+ type doped substrate 202. The top of epitaxial layer 201 may be covered by an oxide layer such as oxide layer 213. Oxide layer 213 may extend and fill the shallow trench isolation (STI) regions 203 and may also serve as the gate oxide dielectric for the pixel circuit transistors and for the various charge transfer gates.

An anti-blooming structure formed from anti-blooming reset transistor Rx and an anti-blooming drain such as n+ type doped anti-blooming drain 204 may be used to control the level of saturation of pixel 200. Charge-integrating pinned diode 233 may interface with reset gate 214 and further with n+ type doped anti-blooming drain 204. Diode 233 may also interface with a transfer gate such as transfer gate 215 and further with another pinned diode such as charge-storage pinned diode 235. Charge-storage pinned diode 235 may be formed from p+ type doped pinning layer 209 and n type well forming layer 210. Charge stored in the charge storage well may be transferred out to an FD node such as FD node 205 via the silicon region under charge transfer gate 216, and via the charge transfer barrier formed by pinning layer 211 and channel forming layer 212. Transfer gate 216 may have an additional implant such as implant 227 included underneath to form a clocked well. This type of configuration may allow charge to be transferred over the potential barrier that has a lower potential than the charge storage well. Charge transferring operations may also include several charge transfer pulses when there is more charge stored in the charge storage well than the clocked well can accommodate.

FD node 205 may be connected to the SF transistor by a metal wiring. For simplicity, this type of metal wiring is not shown in FIG. 2. A metal via such as metal via 217 may connect the metal wiring to the pixel elements formed in silicon epitaxial substrate 201 or on top of gate oxide 213. Pixel 200 may also include additional inter-level (IL) oxide layers such as layers 226 and 225 deposited on the substrate. Oxide layers 226 and 225 may be used for isolating and protecting metal wires.

Pixel 200 may include a shielding layer such as optical shielding layer 218 for preventing light from penetrating into the silicon. Anode electrode 219 may be used to provide additional light shielding for circuitry on substrate 201 and may also reflect light back into photoelectric layer 221, thereby increasing quantum efficiency.

In another suitable embodiment, the type of doping may be reversed and the charge-integrating pinned diode may collect holes instead of electrons. With this type of configuration, transparent electrode 223 may be a positively biased anode, pinning layers 207 may be n+ doped, and charge injector 206 may be p+ type doped. Layer 222 may be formed from a hole blocking material and layer 220 may be formed from an electron blocking material. Epitaxial substrate 201 can be also changed to n type or it can remain the p type doped.

Figure 3:
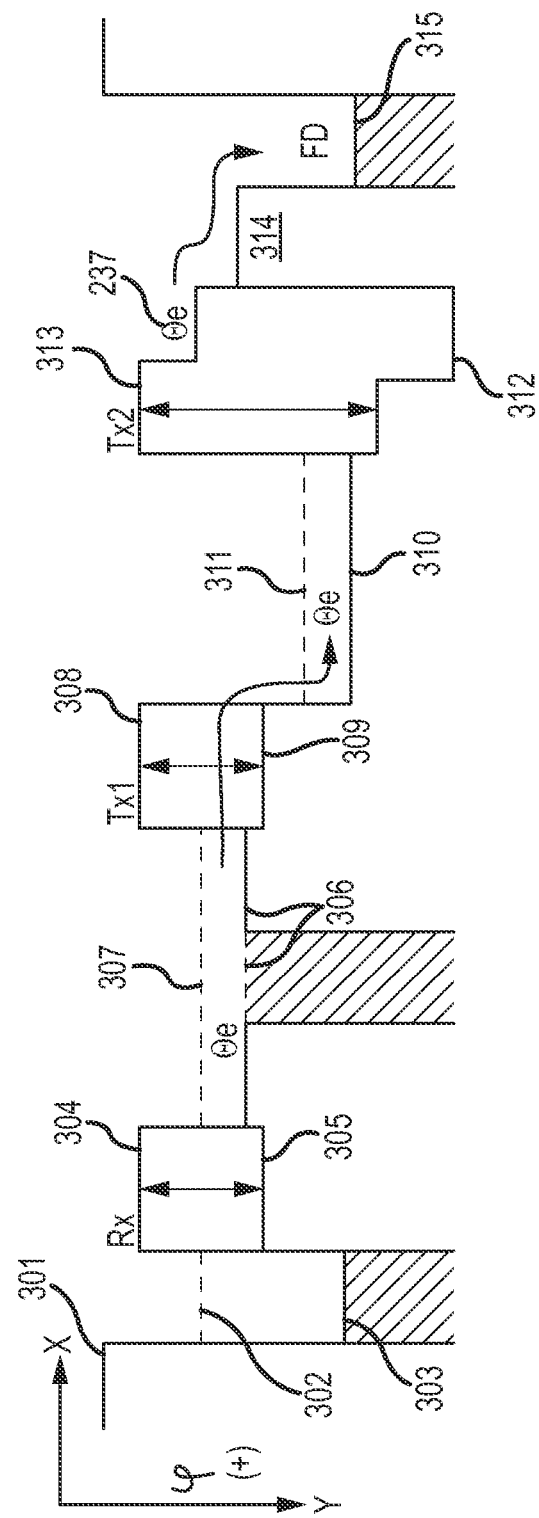
FIG. 3 is a diagram showing the potential profile across an illustrative image sensor pixel of the type shown in FIG. 2 in accordance with an embodiment of the present invention.

FIG. 3 is a simplified potential diagram illustrating the potential profile of a pixel such as image sensor pixel 200 of FIG. 2 during operation. FIG. 3 corresponds to the flow of electrons as they move through the cross-section of the pixel structure shown in FIG. 2, from charge-integrating pinned diode 233 to FD node 205. Level 301 is the zero potential level that corresponds to ground or to the substrate bias. Level 302 corresponds to the potential level of the anti-blooming drain when charge is being injected from the drain to the charge-integrating pinned diode, and level 303 corresponds to the potential level of the anti-blooming drain when charge is drained from the diode or is biased for controlling the blooming. This sequence of steps is sometimes referred to herein as a "fill-and-spill" charge input scheme. Charge injection into the integrating pinned diode and charge removal from the integrating pinned diode may be used to establish a reference level for charge injector region 206. This reference level becomes almost equal to the level 306 of the empty well, but with some residual kTC-reset noise on it. It is therefore beneficial to ensure that the total capacitance of the charge injector node is small. The total capacitance of the charge injector node may be significantly less than that of a standard FD node because there is no source follower (SF) transistor connected to the charge injector node and also because there is no overlap capacitance included from the transfer or reset gates (see, e.g., FIG. 2). The kTC-reset noise of this method of charge input and removal is approximately equal to:

$$Q_n = \sqrt{kTC} \quad (1)$$

whereas the standard CDS operation noise associated with the concept described in the prior art is:

$$Q_n = \sqrt{2kTC} \quad (2)$$

The capacitance of the charge injector node is therefore significantly less than that of the standard FD node, which results in a reduced noise level during readout. The fill-and-spill method also helps to reduce the overall noise produced during readout.

In some cases, it may be advantageous to input charge into charge-integrating pinned diode 233 from the anti-blooming drain side, and to remove it in the direction of charge transfer to the charge-storage pinned diode and to transfer it out through the FD and FD reset transistor to another drain. This method of reset may result in low kTC-reset noise. The charge injection into or draining from the charge-integrating pinned diode may be controlled by the bias of anti-blooming gate 214. When the pixel needs to be reset, anti-blooming gate 214 may be biased at a high level, which moves the blooming barrier 304 to the reset level 305. This clears all charge from the pixel and allows it to flow into the n+ drain 204 biased at level 303. The reset of all the pixels in the array can be made at the same time, which is necessary for global shutter operations. This action marks the beginning of the charge integration time.

When enough charge has integrated in charge-integrating pinned diode 233, for example to the level 307, charge is transferred by pulsing the transfer gate Tx1 between the levels 308 and 309. Pulsing transfer gate Tx1 in this way may move charge to charge-storage pinned diode 235, resulting in potential level 311. Charge may remain in charge-storage pinned diode 235 until readout. Charge transfer to storage regions such as charge-storage pinned diode 235 may be accomplished simultaneously for each pixel of the array, whereas during pixel readout operations, charge is transferred out to FD node 205 sequentially row by row. Pixel readout may be accomplished by pulsing transfer gate Tx2 between the levels 312 and 313, which will cause charge 237 to flow over barrier 314 and onto FD node 205 that has been reset to level 315 prior to the transfer. This type of pixel scanning is sometimes referred to as global shutter (GS) mode of operation.

Operating the image sensor in a global shutter mode of operation is merely illustrative. If desired, the pixels may be scanned in a rolling shutter mode of operation. In this mode of operation, charge is transferred from the charge-integrating pinned diode to the charge-storage pinned diode also in a sequential manner row by row.

Figure 4:
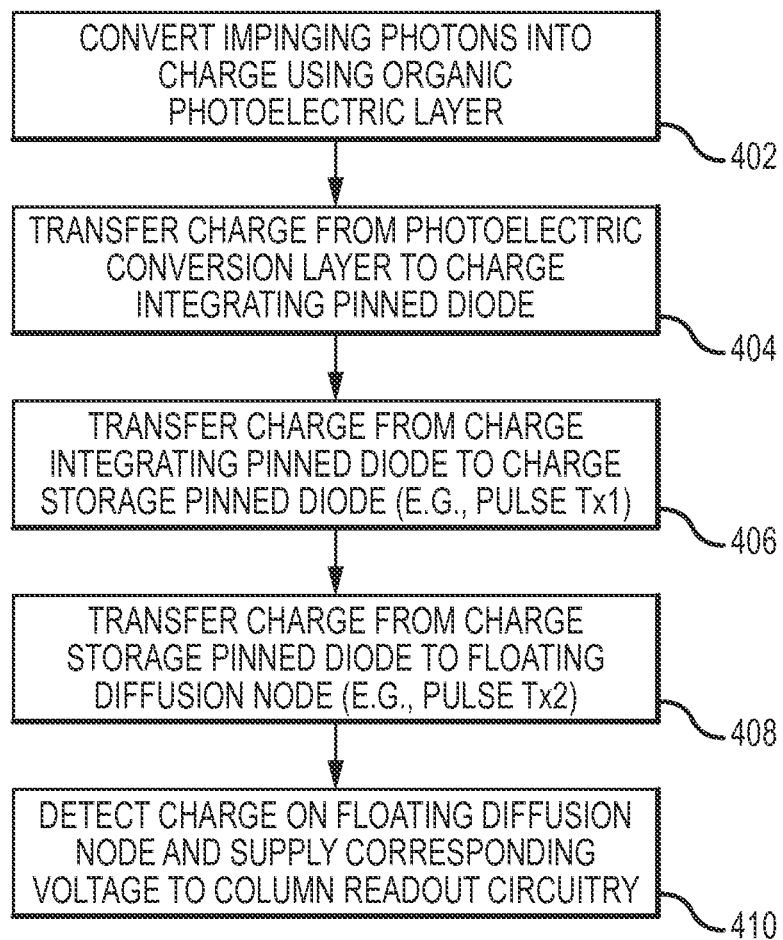
FIG. 4 is a flowchart of illustrative steps involved in operating an image sensor pixel of the type shown in FIG. 2 in accordance with an embodiment of the present invention.

FIG. 4 is a flowchart of illustrative steps involved in operating an image sensor pixel of the type shown in FIG. 2. At step 402, organic photoelectric layer 221 may receive incoming photons 224 and may convert the incoming photons into charge (e.g., into electron-hole pairs).

At step 404, the photo-generated charge may be conveyed from photoelectric layer 221 to charge-integrating pinned diode 233 via anode electrode 219. Anode electrode 219 may be connected to n+ type doped injector region 206 that inputs charge into charge-integrating pinned diode 233. In a global shutter mode of operation, all of the pixels in the pixel array are simultaneously reset just prior to the beginning of charge integration.

At step 406, charge that has been collected in charge-integrating pinned diode 233 may be transferred to charge-storage pinned diode 235. This may be accomplished by pulsing transfer gate Tx1 so that charge moves from charge-integrating pinned diode 233 to charge-storage pinned diode 235. In a global shutter mode of operation, charge transfer from charge-integrating pinned diode 233 to charge-storage pinned diode 235 occurs simultaneously for all of the pixels in the pixel array.

At step 408, the stored charge in charge-storage pinned diode 235 may be transferred to floating diffusion (FD) node 205. This may be accomplished by pulsing transfer gate Tx2 so that charge moves from charge-storage pinned diode 235 to FD node 205. Charge transfer from the charge-storage pinned diode to the FD node may be accomplished for the pixel array in a row-by-row fashion.

At step 410, the potential change of FD node 205 of pixel 200 is sensed by a corresponding source follower transistor, and this potential change is transferred onto the column readout circuits when a corresponding row select transistor is momentarily pulsed on.

Figure 5:
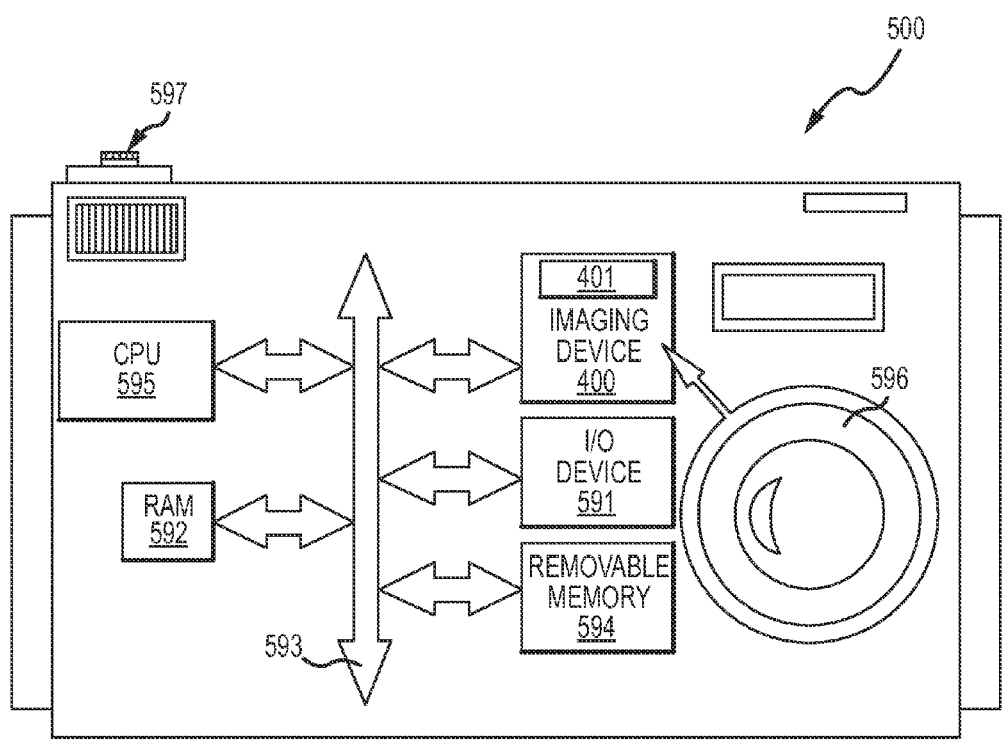
FIG. 5 is a block diagram of a system employing embodiments of FIGS. 2, 3, and 4 in accordance with an embodiment of the present invention.

FIG. 5 shows in simplified form a typical processor system 500, such as a digital camera, which includes an imaging device 400. Imaging device 400 may include a pixel array 401 having pixels of the type shown in FIG. 2 (e.g., pixel array 401 may be an array of pixels 200) formed on an image sensor SOC. Pixel array 401 may include an organic photoelectric conversion layer as described above. The organic photoelectric conversion layer may convert incident photons into charge. An anode electrode may be coupled to an n+ doped charge injection node in each pixel and may convey the photo-generated charge to the charge injection node. The charge injection node may input the charge into a charge-integrating pinned diode. Upon completion of a charge integration cycle, a first transfer transistor may be pulsed to move the charge from the charge-integrating pinned diode to a charge-storage pinned diode. The charge may be transferred from the charge-storage pinned diode to a floating diffusion node by pulsing a second transfer transistor. The potential change of the floating diffusion node may be sensed by a source follower transistor and subsequently transferred to column readout circuitry.

Processor system 500 is exemplary of a system having digital circuits that may include imaging device 400. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 500, which may be a digital still or video camera system, may include a lens such as lens 596 for focusing an image onto a pixel array such as pixel array 401 when shutter release button 597 is pressed. Processor system 500 may include a central processing unit such as central processing unit (CPU) 595. CPU 595 may be a microprocessor that controls camera functions and one or more image flow functions and communicates with one or more input/output (I/O) devices 591 over a bus such as bus 593. Imaging device 400 may also communicate with CPU 595 over bus 593. System 500 may include random access memory (RAM) 592 and removable memory 594. Removable memory 594 may include flash memory that communicates with CPU 595 over bus 593. Imaging device 400 may be combined with CPU 595, with or without memory storage, on a single integrated circuit or on a different chip. Although bus 593 is illustrated as a single bus, it may be one or more buses or bridges or other communication paths used to interconnect the system components.

Having thus described the preferred embodiments of the novel pixel design and its operation intended for CMOS image sensor arrays that are overlaid with organic photoelectric layers, that have reduced kTC-reset noise generation, and that can operate also in the global shutter mode, it is noted that the principles of this invention and various modifications can be made by those skilled in the art without departing from the scope and spirit of the invention.

Various embodiments have been described illustrating an image sensor pixel that can operate in global shutter mode or rolling shutter mode. The image sensor pixel includes an organic photoelectric layer having a high quantum efficiency, large fill factor, and a relatively small thickness.

The image sensor pixel includes a charge integration pinned diode for collecting photo-generated charge. Charge from the charge integration pinned diode can be completely and simultaneously for the whole array transferred to a charge-storage pinned diode with minimal kTC-reset noise generation. Charge from the charge-storage pinned diode can be transferred onto a floating diffusion (FD), also with minimal kTC-reset noise, for detection and conversion to a voltage. Separating the FD node from the charge integration node results in a higher charge conversion factor and lower noise, which in turn results in higher sensor sensitivity and increased dynamic range.

The foregoing is merely illustrative of the principles of this invention which can be practiced in other embodiments.

What is claimed is:

1. An image sensor pixel array having at least one pixel circuit, wherein the at least one pixel circuit comprises:
   an organic photoelectric film configured to convert incident photons into photo-generated charge;
   a charge-integrating pinned diode configured to collect the photo-generated charge;
   a conductive electrode electrically coupled between the organic photoelectric film and the charge-integrating pinned diode, wherein the conductive electrode is configured to convey the photo-generated charge to the charge-integrating pinned diode, wherein the conductive electrode has first and second opposing sides; and
   an n+ type doped charge injector region formed in the charge-integrating pinned diode, wherein the n+ type doped charge injector region is directly connected to the conductive electrode, wherein the charge injector region is configured to receive the photo-generated charge from the conductive electrode and to input the photo-generated charge into the charge-integrating pinned diode, wherein the organic photoelectric film is formed on the first side of the conductive electrode, and wherein the n+ type doped charge injector region is formed on the second side of the conductive electrode.

2. The image sensor pixel array defined in claim 1 wherein the at least one pixel circuit further comprises a charge storage pinned diode.

3. The image sensor pixel array defined in claim 2 wherein the at least one pixel circuit further comprises a charge transfer gate configured to transfer the photo-generated charge from the charge-integrating pinned diode to the charge storage pinned diode.

4. The image sensor pixel array defined in claim 3 wherein the at least one pixel circuit further comprises a floating diffusion node.

5. The image sensor pixel array defined in claim 4 wherein the at least one pixel circuit further comprises an additional charge transfer gate configured to transfer the photo-generated charge from the charge storage pinned diode to the floating diffusion node.

6. The image sensor pixel array defined in claim 1 wherein the at least one pixel circuit further comprises an anti-blooming structure coupled to the charge-integrating pinned diode and wherein the anti-blooming structure is configured to control the saturation level associated with the at least one pixel circuit.

7. The image sensor pixel array defined in claim 6 wherein the anti-blooming structure comprises an anti-blooming reset transistor and an anti-blooming charge drain, and wherein the anti-blooming reset transistor is configured to remove the photo-generated charge from the charge-integrating pinned diode.

8. The image sensor pixel array defined in claim 1 wherein the image sensor pixel array is operable in a global shutter mode.

9. The image sensor pixel array defined in claim 1, wherein the charge-integrating pinned diode includes p+ type doped regions and an n type doped region, and wherein the p+ type doped regions and the n type doped region combine to form a potential well for collecting the injected charge from the n+ type doped charge injector region.

10. The image sensor pixel array defined in claim 9, wherein the n+ type doped charge injector region has a higher doping concentration than the n type doped region and wherein the n type doped region is in direct contact with the p+ type doped regions and the n+ type doped charge injector region.

11. The image sensor pixel array defined in claim 1, wherein the charge-integrating pinned diode comprises an n type doped region, and wherein the n+ type doped charge injector region is surrounded on at least three sides by the n type doped region.

12. A system, comprising:
   a central processing unit;
   memory;
   input-output circuitry; and
   an imaging device, wherein the imaging device comprises a pixel array having at least one pixel circuit, the at least one pixel circuit comprising:
      an organic photoelectric film configured to convert incident photons into photo-generated charge,
      a charge-integrating pinned diode configured to collect the photo-generated charge,
      a conductive electrode electrically coupled between the organic photoelectric film and the charge-integrating pinned diode, wherein the conductive electrode is configured to convey the photo-generated charge to the charge-integrating pinned diode, and
      an n+ type doped charge injector region formed in the charge-integrating pinned diode, wherein the n+ type doped charge injector region is directly connected to the conductive electrode, wherein the charge injector region is configured to receive the photo-generated charge from the conductive electrode and to input the photo-generated charge into the charge-integrating pinned diode, wherein the charge-integrating pinned diode comprises an n type doped region, and wherein the n+ type doped charge injector region is surrounded on at least three sides by the n type doped region.

13. The system defined in claim 12 wherein the at least one pixel circuit further comprises a charge storage pinned diode and a charge transfer transistor configured to transfer the photo-generated charge from the charge-integrating pinned diode to the charge storage pinned diode.

14. The system defined in claim 13 wherein the at least one pixel circuit further comprises a floating diffusion node and an additional charge transfer gate configured to transfer the photo-generated charge from the charge storage pinned diode to the floating diffusion node.

15. The system defined in claim 14 wherein the at least one pixel circuit further comprises an anti-blooming reset transistor and an anti-blooming charge drain coupled to the charge-integrating pinned diode and configured to control the saturation level associated with the at least one pixel circuit.

16. The system defined in claim 12, wherein the conductive electrode has first and second opposing sides, wherein the organic photoelectric film is formed on the first side of the conductive electrode, and wherein the n+ type doped charge injector region and the n type doped region are formed on the second side of the conductive electrode.

17. An image sensor pixel array having at least one pixel circuit, wherein the at least one pixel circuit comprises:
  an organic photoelectric film configured to convert incident photons into photo-generated charge;
  a p type epitaxial layer;
  a charge-integrating pinned diode formed in the p type epitaxial layer that is configured to collect the photo-generated charge, wherein the charge-integrating pinned diode comprises an n type doped region that is surrounded on at least three sides by the p type epitaxial layer and at least one p+ type doped region that is formed in the n type doped region;
  a conductive electrode electrically coupled between the organic photoelectric film and the charge-integrating pinned diode, wherein the conductive electrode is configured to convey the photo-generated charge to the charge-integrating pinned diode and wherein the conductive electrode has first and second opposing sides; and
  an n+ type doped charge injector region formed in the charge-integrating pinned diode, wherein the n+ type doped charge injector region is surrounded on at least three sides by the n type doped region, wherein the n+ type doped charge injector region is directly connected to the conductive electrode, wherein the charge injector region is configured to receive the photo-generated charge from the conductive electrode and to input the photo-generated charge into the charge-integrating pinned diode, wherein the organic photoelectric film is formed on the first side of the conductive electrode, and wherein the n+ type doped charge injector region is formed on the second side of the conductive electrode.

18. The image sensor pixel array defined in claim 17, wherein the at least one p+ type doped region is surrounded on at least two sides by the n type doped region.

19. The image sensor pixel array defined in claim 17, wherein the conductive electrode has a first portion that is formed above at least one inter-level oxide layer and that extends parallel to the organic photoelectric film and wherein the conductive electrode has a second portion that is perpendicular to the first portion that extends through the at least one inter-level oxide layer to directly contact the n+ type doped charge injector region.

20. The image sensor pixel array defined in claim 19, wherein an optical shielding layer is formed in the at least one inter-level oxide layer.

* * * * *